(12) United States Patent
Hashimoto

(10) Patent No.: US 11,675,225 B2
(45) Date of Patent: Jun. 13, 2023

(54) OPTICAL DEVICE MANUFACTURING METHOD AND OPTICAL DEVICE

(71) Applicant: DEXERIALS CORPORATION, Tokyo (JP)

(72) Inventor: Takao Hashimoto, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 743 days.

(21) Appl. No.: 16/478,924

(22) PCT Filed: Feb. 7, 2018

(86) PCT No.: PCT/JP2018/004148
§ 371 (c)(1),
(2) Date: Jul. 18, 2019

(87) PCT Pub. No.: WO2018/179874
PCT Pub. Date: Oct. 4, 2018

(65) Prior Publication Data
US 2021/0294140 A1 Sep. 23, 2021

(30) Foreign Application Priority Data
Mar. 30, 2017 (JP) .............................. JP2017-068082

(51) Int. Cl.
*G02F 1/1333* (2006.01)
*G06F 3/041* (2006.01)

(52) U.S. Cl.
CPC ...... *G02F 1/133331* (2021.01); *G02F 1/1333* (2013.01); *G06F 3/041* (2013.01); *G02F 2202/28* (2013.01)

(58) Field of Classification Search
CPC ........... G02F 1/133331; G02F 2202/28; G02F 1/1333; G02F 1/13332; G06F 3/041;
(Continued)

(56) References Cited

U.S. PATENT DOCUMENTS

2005/0053752 A1  3/2005  Komaki
2014/0209237 A1  7/2014  Ogawa et al.
(Continued)

FOREIGN PATENT DOCUMENTS

JP    2004-109816 A     4/2004
JP    2004109816 A  *  4/2004
(Continued)

OTHER PUBLICATIONS

Oct. 7, 2020 Search Report issued in European Patent Application No. 18774794.4.
(Continued)

*Primary Examiner* — Jia X Pan
(74) *Attorney, Agent, or Firm* — Oliff PLC

(57) ABSTRACT

An optical device manufacturing method and an optical device capable of forming a desired cured resin layer regardless of shapes of cover members. The method includes closely laminating a cover member having an opening onto a mold member having a fitting projection which fits to the opening so that the fitting projection is fitted to the opening to form a hollow laminated body capable of being filled with a curable resin; filling the hollow portion of the laminated body with the curable resin; curing the curable resin to form a cured resin layer on the cover member; peeling off the mold member from the cover member; and bonding the cured resin layer and an optical member.

22 Claims, 7 Drawing Sheets

(58) Field of Classification Search
CPC ......... B29C 33/00; B29C 39/26; B29C 33/12; B29C 39/10
See application file for complete search history.

(56) References Cited

U.S. PATENT DOCUMENTS

| | | | |
|---|---|---|---|
| 2014/0285746 A1* | 9/2014 | Huang | G02F 1/133308 349/58 |
| 2016/0011633 A1* | 1/2016 | Watanabe | G02F 1/1333 345/184 |
| 2016/0363793 A1 | 12/2016 | Ogawa et al. | |
| 2017/0299913 A1* | 10/2017 | Choi | G02B 6/0088 |
| 2019/0033633 A1 | 1/2019 | Ogawa et al. | |

FOREIGN PATENT DOCUMENTS

| JP | 2007-272107 A | 10/2007 |
|---|---|---|
| JP | 2009-086656 A | 4/2009 |
| JP | 2014-119520 A | 6/2014 |
| JP | 2017-026887 A | 2/2017 |
| TW | M362567 U | 8/2009 |

OTHER PUBLICATIONS

Dec. 23, 2020 Office Action issued in Chinese Patent Application No. 201880017968.1.
Apr. 3, 2018 International Search Report issued in International Patent Application No. PCT/JP2018/004148.
May 25, 2021 Office Action issued in Taiwanese Patent Application No. 107110419.
Oct. 11, 2021 Office Action issued in Chinese Patent Application No. 201880017968.1.
Nov. 25, 2020 Office Action issued in Korean Patent Application No. 10-2019-7021020.
May 28, 2020 Korean Office Action issued in Korean Patent Application No. 10-2019-7021020.
Jan. 5, 2022 Office Action issued in Taiwanese Patent Application No. 107110419.
May 12, 2022 Office Action issued in Japanese Patent Application No. 2021-075274.

* cited by examiner

OPTICAL DEVICE MANUFACTURING METHOD AND OPTICAL DEVICE

TECHNICAL FIELD

The present technology relates to an optical device manufacturing method and an optical device in which an optical member such as a liquid crystal display panel and a cover member such as a protective sheet disposed on the surface side of the optical member are laminated via a cured resin layer. This application claims the priority based on Japanese Patent Application No. 2017-068082 filed on Mar. 30, 2017 in Japan, and this document is incorporated into the present application by reference.

BACKGROUND ART

Conventionally, image display devices such as liquid crystal display panels used in information terminals such as smart phones and car navigation systems are manufactured by applying a photocurable resin composition to a light transmitting cover member, irradiating ultraviolet rays to precure the composition to form precured resin layer, laminating an image display member such as a liquid crystal display panel or an organic EL panel via the precured resin layer, and then irradiating again ultraviolet rays to the precured resin layer for final curing to form a photo cured resin layer (PLT 1).

Known methods of applying a photocurable resin composition to a light transmitting cover member include discharging a photocurable resin composition from a moving slit nozzle to the surface of the light transmitting cover member over the entire width, and applying a photocurable resin composition by screen printing, among others. In addition, a light transmitting cover member curved in one direction has also been proposed to improve the design and touch feeling of the image display device; for such a curved light transmitting cover member, a method of filling a photocurable resin composition to the concavely curved surface of the light transmitting cover member by a dispenser has also been proposed.

CITATION LIST

Patent Literature

PLT 1: Japanese unexamined patent application No. 2014-119520

SUMMARY OF INVENTION

Technical Problem

However, as the design and operability of image display devices have diversified, there has been proposed a configuration in which an opening is provided in a part of the light transmitting cover member and a mechanism of an image display member is exposed through the opening, or a configuration in which the display surface of the image display member is concavely curved and the surface of the light transmitting cover member to which the photocurable resin composition is applied is convexly curved.

Unfortunately, it is difficult for the above-described conventional method to form a substantially uniform photocurable resin layer to the light transmitting cover member in which the opening is partially formed and the light transmitting cover member in which the application surface of the photocurable resin composition is convexly curved.

Therefore, an object of the present technology is to provide an optical device manufacturing method and an optical device capable of forming a desired cured resin layer regardless of shapes of cover members.

Solution to Problem

In order to solve the problems described above, an optical device manufacturing method according to the present technology comprises closely laminating a cover member having an opening onto a mold member having a fitting projection which fits to the opening so that the fitting projection is fitted to the opening to form a hollow laminated body capable of being filled with a curable resin, filling the hollow portion of the laminated body with the curable resin; curing the curable resin to form a cured resin layer on the cover member; peeling off the mold member from the cover member; and bonding the cured resin layer and an optical member.

In addition, an optical device according to the present technology includes: a cover member having an opening; an optical member; and a cured resin layer laminated between the cover member and the optical member, wherein the cured resin layer is not formed between the opening and the optical member.

Advantageous Effects of Invention

According to the present technology, by filling the hollow portion of the laminated body of the cover member and the mold member with a curable resin and curing the resin, a substantially uniform cured resin layer can be formed on a cover member in which an opening is partially formed or on a cover member in which the surface to which the curable resin is supplied is convexly curved.

DESCRIPTION OF EMBODIMENTS

Figure 1:
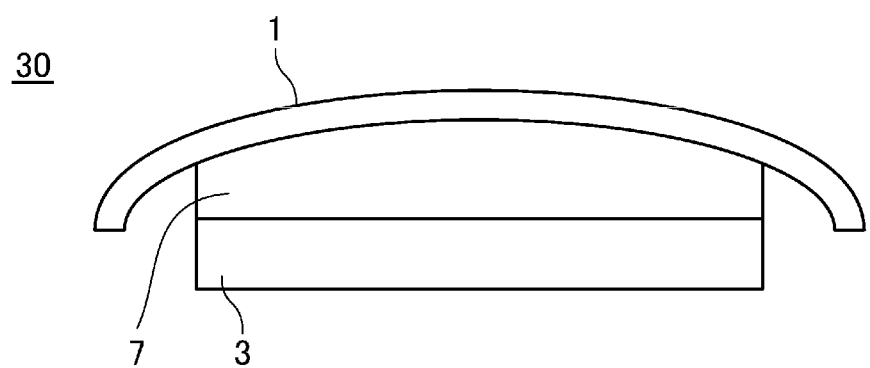
FIG. 1 is a side view illustrating an optical device in which a cover member and an optical member are laminated via a cured resin layer.

Hereinafter, an optical device manufacturing method and an optical device according to the present technology will be described in detail with reference to the drawings. It should be noted that the present disclosure is not limited to the following embodiments and various modifications can be made without departing from the scope of the present technology. Moreover, the features illustrated in the drawings are shown schematically and are not intended to be drawn to scale. Actual dimensions should be determined in consideration of the following description. Furthermore, those skilled in the art will appreciate that dimensional relations and proportions may be different among the drawings in certain parts.

The present technology provides an optical device manufacturing method for manufacturing an optical device 30 in which, as shown in FIG. 1, an optical member 3 and a cover member 1 are laminated via a cured resin layer 7, including a step (A) of closely laminating the cover member 1 having an opening 2 onto a mold member 4 having a fitting projection 11 which fits to the opening 2 so that the fitting projection 11 is fitted to the opening 2 to form a hollow laminated body 5 which can be filled with a curable resin 6, a step (B) of filling the hollow portion of the laminated body 5 with the curable resin 6, a step (C) of curing the curable resin 6 to form a cured resin layer 7 on the cover member 1, a step (D) of peeling off the mold member 4 from the cover member 1, and a step (E) of bonding the cured resin layer 7 and the optical member 3 together.

Cover Member/Opening

After the mold member 4 is closely laminated to the cover member 1 at a bonding surface to be bonded with the optical member 3 for forming the cured resin layer 7, the cover member 1 is bonded to the optical member 3 through the cured resin layer 7.

The cover member 1 may be a light transmitting cover member, for example. For the light transmitting cover member, any material having a light transmitting property may be used as long as images formed on the optical member can be visually recognized; examples thereof include resin materials such as glass, acrylic resin, polyethylene terephthalate, polyethylene naphthalate, and polycarbonate. These materials can be subjected to single-sided or double-sided hard coating treatment, and antireflection treatment, among others. Moreover, when the optical member described later is a touch panel, a part of this touch panel can also be used as a cover member.

Figure 2:
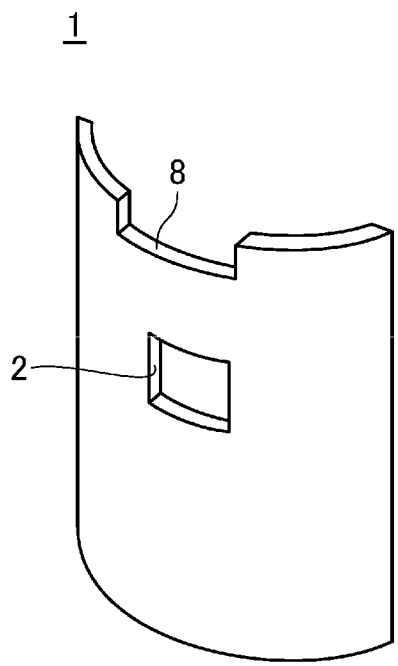
FIG. 2 is an external perspective view of a cover member.

In addition, the cover member 1 has an opening 2 formed therein as shown in FIG. 2. The opening 2 is for directly exposing the optical member 3 described below to the outside, and the cured resin layer 7 is not provided between the opening 2 and the optical member 3 of the optical device 30. The shape of the opening 2 is not particularly limited, and may be formed, for example, in a substantially rectangular shape. Further, one or more openings 2 are formed at positions corresponding to the positions of the optical member 3 to be exposed, and one of them is formed, for example, in a substantially central portion of the cover member 1 formed in a rectangular shape.

The shape of the cover member 1 is not particularly limited, and may be, for example, a flat shape, a shape curved in one direction as shown in FIG. 2, a shape having a rotated paraboloid, a hyperbolic paraboloid, or another quadric surface, or may have a flat portion in a part of a curved shape and a quadric surface shape.

Figure 3:
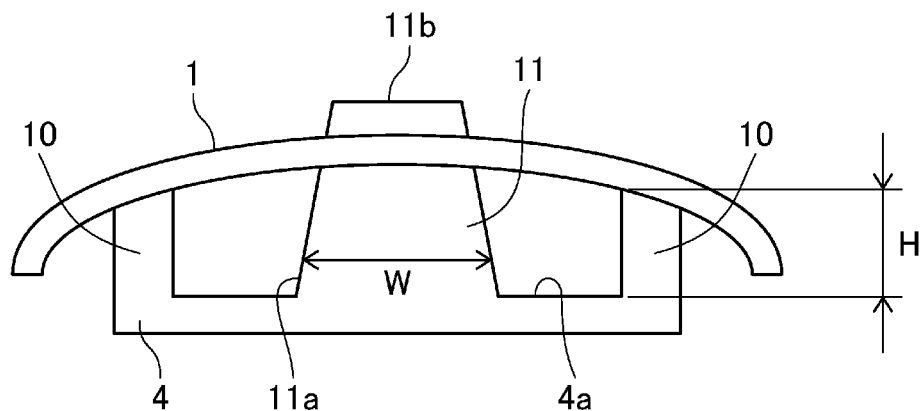
FIG. 3 is a side view illustrating a laminated body in which a cover member and a mold member are closely laminated.
Figure 4:
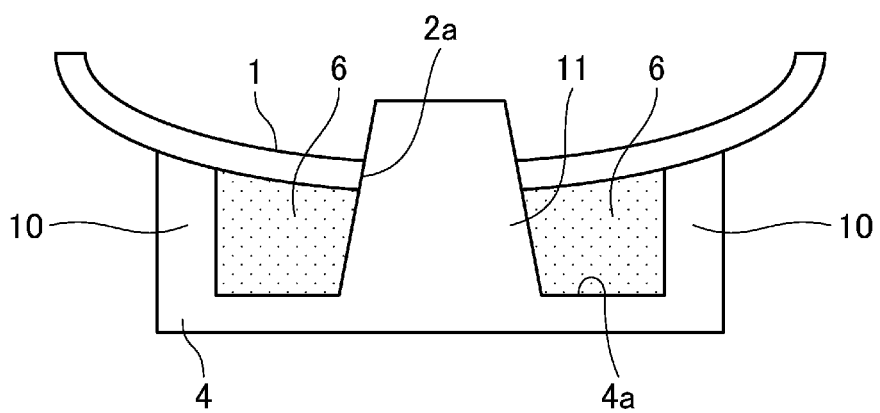
FIG. 4 is a cross-sectional view illustrating a laminated body in which a cover member and a mold member are closely laminated.
Figure 5:
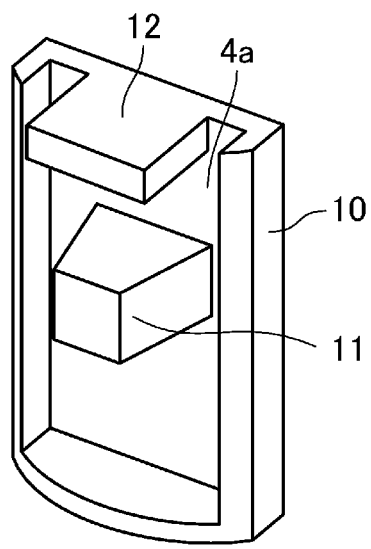
FIG. 5 is an external perspective view of a mold member.

The present technology is effective in that the cured resin layer can be formed in the area excluding the opening even if the cover member having the opening has a curved shape or a quadratic curved shape. Therefore, for example, the cover member may have a convex shape the cross-section of which is convexly curved relative to the mold member 4 as shown in FIG. 3, or conversely, may have a concave shape the cross-section of which is concavely curved relative to the mold member 4 as shown in FIG. 4.

It should be noted that the dimensional characteristics such as the shape of the curvature and thickness and physical properties such as elasticity of the cover member can be appropriately determined according to the purpose of use.

Moreover, a deformed part 8 such as a recess may be formed in an outer edge of the cover member 1. The deformed part 8 is a region facing mounted components such as a flexible substrate or an IC chip mounted on the optical member 3, and the cured resin layer 7 is not formed in this region as with the opening 2 since this region should also be opened. The position, shape, and number of the deformed parts 8 vary depending on the shape, and arrangement, among others of the mounted components of the optical member 3; an example shown in FIG. 2 is formed as a region recessed in a rectangular shape at the center of the upper edge of the cover member 1.

Optical Member

Examples of the optical member 3 include image display members such as a liquid crystal display panel, an organic EL display panel, a plasma display panel, and a touch panel, among others. Here, the touch panel means an image display/input panel which combines a display element such as a liquid crystal display panel and a position input device such as a touch pad. The surface shape of such an optical member on the cover member side is not particularly limited, but is preferably flat. Moreover, a polarizing plate may be arranged on the surface of the optical member.

Mold Member

The mold member 4 constituting the laminated body by being closely laminated to the cover member 1 forms a hollow laminated body 5 that can be filled with the curable resin 6 by being closely laminated to the cover member 1 at the bonding surface to be bonded to the optical member 3. By curing the curable resin 6 filled between the cover member 1 and the mold member 4, the cured resin layer 7 is formed on the bonding surface to be bonded to the optical member 3.

The mold member 4 is preferably formed of an elastic member. By having elasticity, the mold member 4 improves adhesion to the cover member 1 and can be released from the cover member 1 after forming the cured resin layer 7, and the restorability thereof allows repeated use. As a material of such a mold member 4, a silicone rubber material is suitable, for example.

The mold member 4 is formed, for example, in a substantially rectangular plate shape, and includes a main surface 4a facing the bonding surface of the cover member 1, a side wall 10 which rises from the side edge of the main surface 4a and in close contact with the bonding surface of the cover member 1, and a fitting projection 11 fitting in the opening 2 of the cover member 1.

Figure 8:
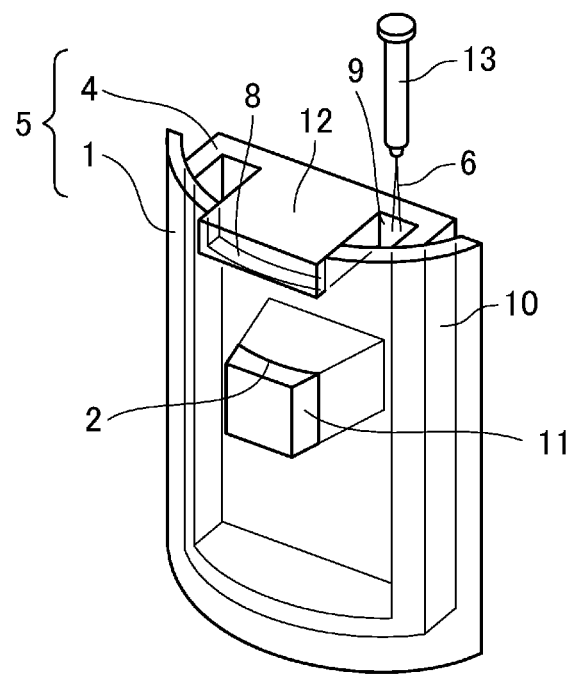
FIG. 8 is an external perspective view illustrating a process of filling a hollow portion of a laminated body with a liquid curable resin.

As shown in FIG. 8, the side wall 10 is formed to surround the main surface 4a such that the curable resin 6 can be injected into and held in the laminated body 5 formed with the cover member 1, and in the case of rectangular main surface 4a, formed at three edges. When the mold member 4 is laminated in close contact with the cover member 1, the side wall 10 forms a hollow portion surrounded by three sides, in which the curable resin 6 is filled. Furthermore, on one side surface where the side wall 10 is not formed, the mold member 4 has an open end 9 serving as an injection port for injecting the curable resin 6 into the hollow portion of the laminated body 5. It should be noted that the side wall 10 may be provided on all the side edges of the main surface 4a as long as the open end 9 serving as an injection port is partially opened in order to inject the curable resin 6 into the laminated body 5. Further, the upper surface of the side wall 10 in close contact with the cover member 1 is appropriately curved according to the surface shape of the cover member 1 to achieve close contact without clearance.

In the mold member 4, as shown in FIG. 3, the height of the side wall 10 is the height of the hollow portion of the laminated body 5. That is, the mold member 4 can control the thickness of the cured resin layer 7 to be formed on the bonding surface of the cover member 1 by adjusting the height H of the side wall 10.

The fitting projection 11 is formed at a position corresponding to the opening 2 of the main surface 4a. The fitting projection 11 has a protruded shape corresponding to the shape of the opening 2 and has, for example, a substantially cubic shape that can be fitted into the rectangular opening 2.

Further, the outer diameter W of the fitting projection 11 in cross sectional view is preferably gradually decreases toward the tip end portion 11b, which is the insertion end to the opening 2, from the base portion 11a on the main surface 4a side so that the side surfaces are tapered in the height direction. In the fitting projection 11, the base portion 11a on the main surface 4a side is larger than the opening 2, and the tip end portion 11b is smaller than the opening 2. As a result, the fitting projection 11 can be easily inserted into the opening 2, and when inserted into the opening 2, the tapered side surface can be in close contact with the inner side surface 2a of the opening 2 and fitted without clearance. Therefore, the laminated body 5 can prevent the curable resin 6 from adhering to the inner side surface 2a of the opening 2 of the cover member 1.

In addition, the mold member 4 may include one or more fitting projection 11 according to the number of the opening 2 of the cover member 1.

Further, the mold member 4 is provided with a deformed projection 12 that fits in the deformed part 8 formed in the cover member 1 to form, in the cover member 1, a region in which the cured resin layer 7 is not formed. The position, shape, and number of the deformed projection 12 vary depending on the position, shape, and number, among others of the deformed parts 8 of the cover member 1 and the deformed projection 12 in this example is formed as a projection which protrudes in a rectangular shape to the upper edge of the mold member 4. The mold member 4 has open ends 9 on both sides of the deformed projection 12 and these open ends 9 form injection ports into which the curable resin 6 is injected when the mold member 4 is in close contact with the cover member 1 to form the laminated body 5.

Figure 6:
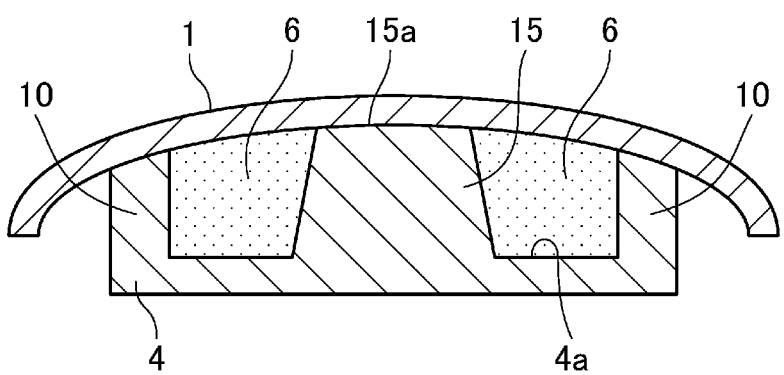
FIG. 6 is a cross-sectional view illustrating a laminated body in which a contact projection formed on a mold member is in close contact with a cover member.

As shown in FIG. 6, the mold member 4 may be provided with a contact projection 15 that is in close contact with the bonding surface of the cover member 1 to form, in the cover member 1, a region in which the cured resin layer 7 is not formed. The contact projection 15 has, for example, a substantially cubic shape, and when the mold member 4 is closely laminated on the cover member 1, the contact projection 15 abuts on the bonding surface of the cover member 1 to prevent the curable resin 6 from flowing into the contact area and forming the cured resin layer 7. Therefore, in the cured resin layer 7 formed on the bonding surface of the cover member 1, a concave lacking the cured resin layer 7 is formed in a shape corresponding to the contact surface of the contact projection 15. Then, an electronic component is mounted on the optical member 3 at a position corresponding to the concave thereby avoiding the contact with the cured resin layer 7. It should be noted that the contact projection 15 has a top surface 15a closely contacting to the bonding surface of the cover member 1 and the top surface 15a preferably has a curved surface shape according to the curved shape of the bonding surface of the cover member 1.

Moreover, the mold member 4 preferably has a light transmitting property. By using the mold member 4 having a light transmitting property, in the case where a photocurable resin is used as the curable resin 6 filled in the laminated body 5 as described later, it is possible to irradiate curing light such as ultraviolet light from the mold member 4 side of the laminated body 5, so that the curable resin 6 can be reliably cured even when a light shielding portion is formed on the cover member 1.

Cured Resin Layer

The cured resin layer 7 interposed between the cover member 1 and the optical member 3 has, for example, a light transmitting property, and allows visual recognition of an image displayed by the optical member 3 such as an image display member.

Examples of the curable resin 6 constituting the cured resin layer 7 include a thermosetting resin and a photocurable resin. The photocurable resin composition is liquid, and specifically shows a viscosity of 0.01 to 100 Pa*s (25° C.) with a cone-plate viscometer.

Such photocurable resin composition preferably contains a base component (component (a)), an acrylic monomer component (component (b)), a plasticizer component (component (c)) and a photopolymerization initiator (component (d)).

Component (a) The base component (a) is a film-forming component of the light transmitting cured resin layer, and is a component containing at least one of an elastomer and an acrylic oligomer. Both may be used in combination as the component (a).

Examples of elastomers include acrylic copolymer consisting of acrylic ester, polybutene, and polyolefin, among others. The weight average molecular weight of the acrylic ester copolymer is preferably 5,000 to 500,000, and the number of repetitions n of polybutene is preferably 10 to 10,000.

Preferred examples of acrylic oligomers include (meth) acrylate oligomers having a backbone of polyisoprene, polyurethane or polybutadiene, among others. In the present specification, the term "(meth) acrylate" includes acrylate and methacrylate.

Preferred examples of (meth) acrylate oligomers having a polyisoprene backbone include esterified product of maleic anhydride adduct of polyisoprene polymer and 2-hydroxyethyl methacrylate UC102 (KURARAY) (molecular weight in terms of polystyrene: 17,000), UC203 (KURARAY)

(molecular weight in terms of polystyrene: 35,000), and UC-1 (KURARAY) (molecular weight about 25,000).

Preferred examples of the (meth) acrylic-type oligomers having a polyurethane backbone include aliphatic urethane acrylate (EBECRYL 230 (Daicel-Cytec) (molecular weight of 5,000) and UA-1 (Light Chemical), among others.

For (meth) acrylate oligomer, known (meth) acrylate oligomer having a polybutadiene backbone may be employed.

Component (b)

The acrylic monomer component (b) is used as a reactive diluent in order to impart sufficient reactivity and coatability to the photocurable resin composition in the manufacturing process of the optical device. Examples of such acrylic monomers include 2-hydroxypropyl methacrylate, benzyl acrylate, and dicyclopentenyloxyethyl methacrylate, among others.

It should be noted that the total content of the base component (a) and the acrylic monomer component (b) in the photocurable resin composition is preferably 25 to 85% by mass.

Component (c)

The plasticizer component (c) is used to impart a buffer property to the cured resin layer and to reduce the cure shrinkage of the photocurable resin composition, and does not react with the acrylate oligomer component of a component (a) and the acrylic monomer component of a component (b) during irradiation of an ultraviolet-ray. Such plasticizer components contain a solid tackifier (1) and a liquid oil component (2).

Examples of the solid tackifier (1) include: terpene-based resins such as terpene resin, terpene phenol resin, and hydrogenated terpene resin; rosin-based resins such as natural rosin, polymerized rosin, rosin ester, and hydrogenated rosin; and terpene-based hydrogenated resins, among others. In addition, non-reactive oligomers obtained by low molecular weight polymerizing the above-mentioned acrylic monomers in advance can also be used; specifically, copolymers of butyl acrylate and 2-hexyl acrylate and acrylic acid, or copolymers of cyclohexyl acrylate and methacrylic acid can be used.

The liquid oil component (2) may contain a polybutadiene type oil or a polyisoprene type oil.

The content of the plasticizer component (c) in the photocurable resin composition is preferably 10 to 65% by mass.

Component (d)

As the photopolymerization initiator designated as the component (d), known photo radical polymerization initiators can be used, which include 1-hydroxy-cyclohexyl phenyl ketone (IRGACURE 184, Ciba Specialty Chemicals), 2-hydroxy-1-{4-[4-(2-hydroxy-2-methyl-propionyl) benzyl] phenyl}-2-methyl-1-propan-1-one (IRGACURE 127, Ciba Specialty Chemicals), benzophenone, and acetophenone, among others.

Insufficient amount of such a photopolymerization initiator relative to 100 parts by mass in total of the base component (a) and the acrylic monomer component (b) result in insufficient curing at the time of ultraviolet irradiation and excessive amount tends to cause problems of foaming since cleavage will increase outgassing; the amount, therefore, is preferably 0.1 to 5 parts by mass, and more preferably 0.2 to 3 parts by mass.

The photocurable resin composition can also contain a chain transfer agent for the purpose of adjusting the molecular weight. For example, 2-mercaptoethanol, lauryl mercaptan, glycidyl mercaptan, mercaptoacetic acid, 2-ethylhexyl thioglycolate, 2,3-dimethyl capto-1-propanol, and α-methylstyrene dimer may be used.

The photocurable resin composition may further contain, if necessary, general additives including an adhesion improver such as a silane coupling agent and an antioxidant. Further, with regard to the components (a) to (d) of the photocurable resin composition, the components (a) may not be used if appropriate components (b) and (c) are employed.

Manufacturing Steps

Next, steps for manufacturing an optical device will be described.

Step A

Figure 7:
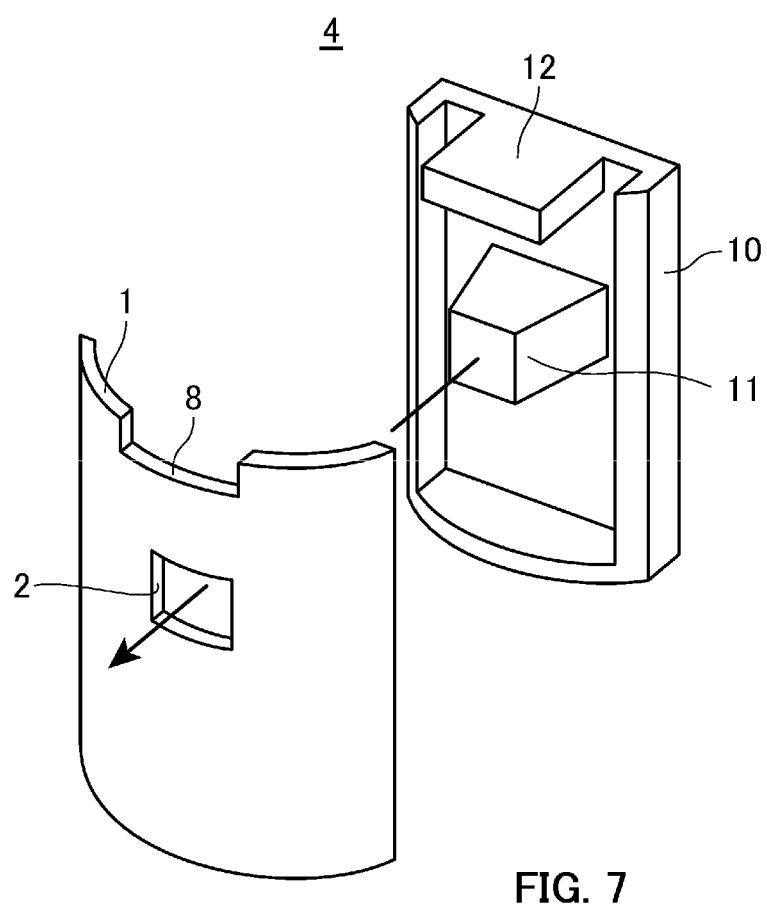
FIG. 7 is an external perspective view illustrating a process of closely laminating a cover member and a mold member so as to fit a fitting projection into an opening.

First, as shown in FIGS. 7 and 3, the mold member 4 is closely laminated on the cover member 1 to form a hollow laminated body 5. The laminated body 5 is closely laminated, for example, by sandwiching both outer sides of the cover member 1 and the mold member 4 by a pair of plate-like members (not shown).

In the laminated body 5, the side wall 10 of the mold member 4 is in close contact with the bonding surface of the cover member 1 to form a hollow portion in which one side of the outer edge is opened. Further, in the laminated body 5, the fitting projection 11 of the mold member 4 is fitted in the opening 2 formed in the cover member 1. In the laminated body 5, by forming the mold member 4 with an elastic material such as silicone rubber, it can be in close contact with the bonding surface of the cover member 1 without clearance to prevent leakage of the liquid curable resin 6 and the fitting projection 11 is in close contact with the inner side surface 2a of the opening 2, which can prevent adhesion of the curable resin 6.

Further, in the case that the deformed part 8 is formed on the cover member 1 and the deformed projection 12 to be fitted to the deformed part 8 is formed on the mold member 4, fitting the deformed projection 12 to the deformed part 8 can prevent adhesion of the curable resin 6.

Figure 9:
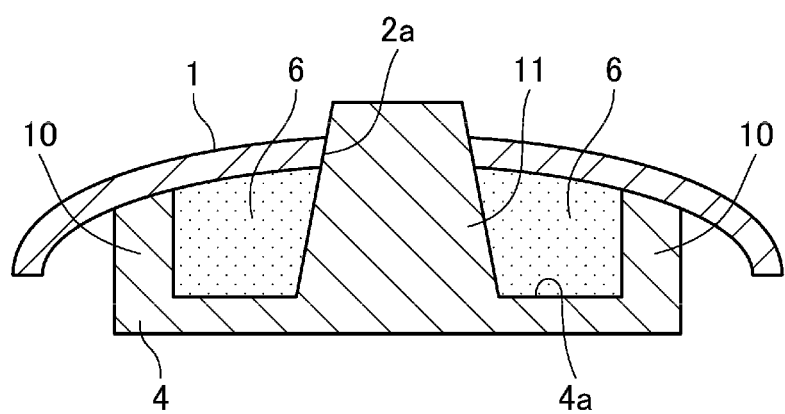
FIG. 9 is an external perspective view illustrating a laminated body in which a fitting projection is fitted in an opening.

Next, as shown in FIGS. 8 and 9, the liquid curable resin 6 is injected from the open end 9 of the laminated body 5 by a dispenser 13 and the hollow portion is filled with the liquid curable resin 6. At this time, the laminated body 5 is supported so that the open end 9 is vertically upward to allow the injection and filling of the liquid curable resin 6.

Step C

Figure 10:
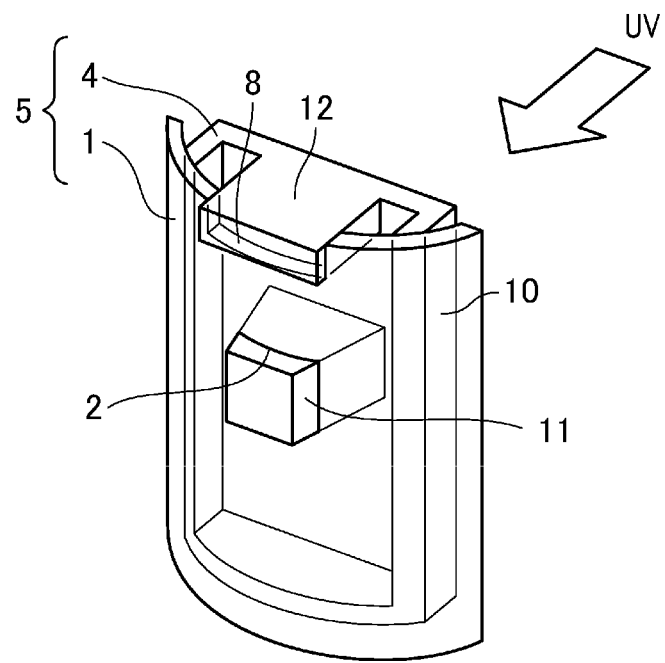
FIG. 10 is an external perspective view illustrating a process of irradiating curing light from the mold member side of the laminated body.
Figure 11:
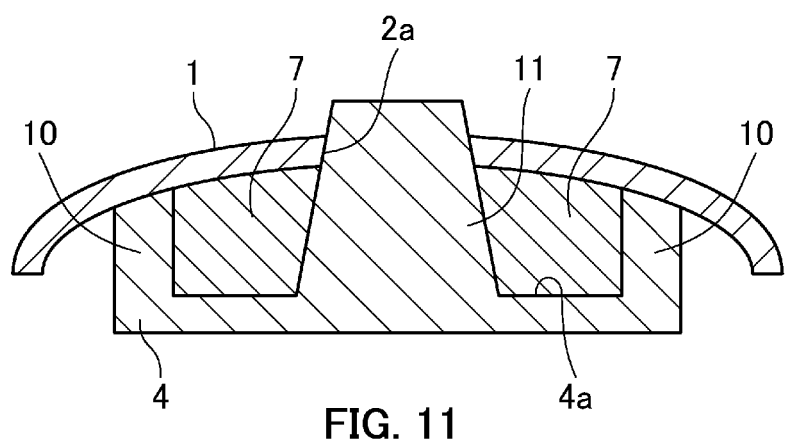
FIG. 11 is a cross-sectional view illustrating a laminated body in which a mold member and a cover member on which a cured resin layer is formed are closely laminated.

Next, as shown in FIG. 10, the curable resin 6 filled in the laminated body 5 is cured to form a cured resin layer 7 on the bonding surface of the cover member 1 as shown in FIG. 11. Specifically, when a photocurable resin is used as the curable resin 6, the curable resin 6 is irradiated with ultraviolet light UV to be cured to form a cured resin layer 7.

Here, when the mold member 4 has a light transmitting property, curing light such as ultraviolet light can be irradiated from the mold member 4 side of the laminated body 5 to the photocurable curable resin 6 filled in the laminated body 5. Therefore, the curable resin 6 can be reliably cured even when a light shielding portion is formed on the cover member 1.

It is a matter of course that the curable resin 6 may be cured by irradiating curing light to the laminated body 5 from the cover member 1 side, from the mold member 4 side, or both.

The curable resin 6 needs to be cured to at least such an degree that the shape of the cured resin layer 7 is maintained when the mold member 4 is peeled off from the cover member 1. This curing degree is such that the curing rate (gel fraction) of the curable resin 6 is preferably 10 to 90%, and more preferably 40 to 90%. The curing rate (gel fraction) means the ratio of the amount of (meth) acryloyl groups after ultraviolet irradiation to the amount of (meth) acryloyl groups before ultraviolet irradiation (consumption rate) in the photocurable curable resin 6, and the larger the value, the more the curing progresses.

The curing rate (gel fraction) can be calculated by substituting absorption peak height (hx) of 1640 to 1620 cm$^{-1}$ from the baseline in the FT-IR measurement chart of the resin composition layer before ultraviolet irradiation and absorption peak height (hy) of 1640 to 1620 cm$^{-1}$ from the baseline in the FT-IR measurement chart of the resin composition layer after UV irradiation into the following formula.

$$\text{curing rate } (\%) = \{(hx-hy)/hx\} \times 100 \quad \text{Formula 1}$$

With regard to the irradiation of ultraviolet light, the type of light source, the output, and the accumulated light quantity, among others, are not particularly limited as long as a precure at a curing rate (gel fraction) of preferably 10 to 80% is achieved and known photo radical polymerization process conditions of (meth) acrylate by ultraviolet irradiation can be adopted.

In addition, ultraviolet irradiation conditions are selected such that at least liquid dripping or deformation of the cured resin layer 7 does not occur during the bonding operation in the bonding step of the step (E) described later within the range of the curing rate described above. The condition that does not cause such liquid dripping or deformation can be expressed by viscosity of 20 Pa*S or more (cone plate rheometer, 25° C., cone and plate C 35/2, rotation speed 10 rpm).

Of course, the cured resin layer 7 may be formed by final curing of the curable resin 6. The curing degree of the curable resin 6 is appropriately set according to various conditions such as the physical properties and filling conditions of the curable resin, the conditions of the bonding step with the optical member 3 described later, and the environment.

In addition, when a thermosetting resin is used as the curable resin 6, the laminated body 5 is subjected to heat treatment to cure the curable resin 6 to form a cured resin layer 7.

Step D

Figure 12:
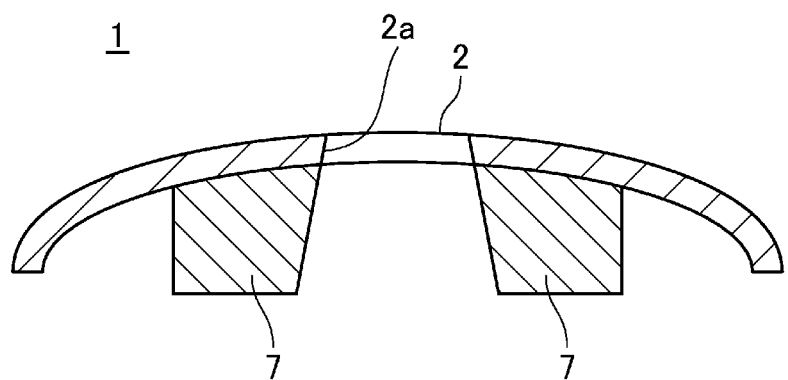
FIG. 12 is a cross-sectional view illustrating a cover member on which a cured resin layer is formed.

Subsequently, the mold member 4 is peeled off from the cover member 1. By using an elastic body such as silicone rubber to form the mold member 4, it can be easily peeled off from the cover member 1 and can be used repeatedly due to the restoring property thereof. In addition, the cured resin layer 7 is formed on the bonding surface of the cover member 1. As shown in FIG. 12, the cured resin layer 7 has a thickness corresponding to the height of the side wall 10 of the mold member 4. Further, in the cover member 1, the cured resin layer 7 is not adhered to the opening 2 and the inner side surface 2a of the opening 2 in which the fitting projection 11 had been fitted. Similarly, in the cover member 1, the cured resin layer 7 is not adhered to the inner side surface of the deformed part 8 in which the deformed projection 12 had been fitted. Further, in the cover member 1, when the contact projection 15 is formed on the mold member 4, the cured resin layer 7 is not formed in the region with which the contact projection 15 had been in close contact.

Step E

Figure 13:
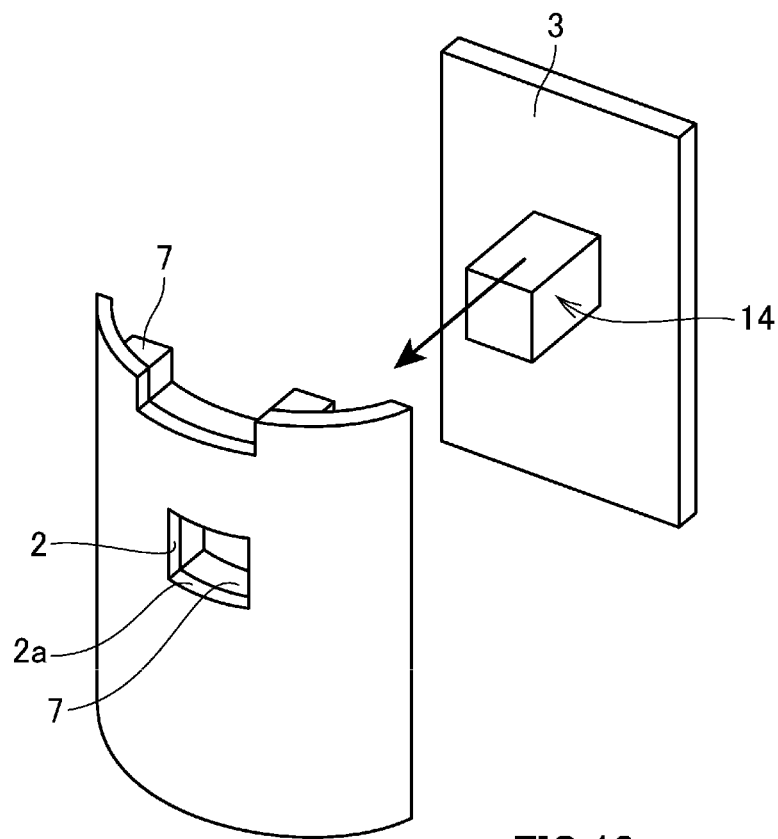
FIG. 13 is an external perspective view illustrating a process of bonding an optical member and a cover member on which a cured resin layer is formed.

Next, as shown in FIG. 13, the cured resin layer 7 of the cover member 1 and the optical member 3 are bonded to each other. Thus, the optical device 30 is formed. The bonding step of the cover member 1 and the optical member 3 can be performed by pressurizing with a predetermined temperature and pressure using a known pressure bonding apparatus. In addition, in this bonding step, in order to prevent air bubbles from entering the interfaces among the cured resin layer 7, the optical member 3 and the cover member 1, it is preferable to perform lamination by a so-called vacuum bonding method. In addition, after the laminating step, a known pressure degassing treatment may be performed on the bonded product of the cover member 1 and the optical member 3 (example of processing conditions: 0.2 to 0.8 MPa, 25 to 60° C., 5 to 20 minutes).

Step F

It should be noted that, in the case where the curable resin 6 is precured in the step C, a step of final curing of the cured resin layer 7 is performed after the cover member 1 and the optical member 3 are bonded to each other. This final curing step can cure the cured resin layer 7 sufficiently, thereby bonding and laminating the optical member 3 and the cover member 1. The level of the final curing is such that the curing rate (gel fraction) of the cured resin layer 7 is preferably 90% or more, more preferably 95% or more.

As described above, by filling and curing the curable resin 6 in the hollow portion of the laminated body 5 constituted by the cover member 1 and the mold member 4, the manufacturing steps according to the present technology can form a substantially uniform cured resin layer 7 flattened according to the dimensions of the main surface 4a of the mold member 4 and the side wall 10 on the cover member 1 in which the opening 2 is partially formed or the cover member 1 in which the application surface of the photocurable resin composition is convexly curved.

Optical Device 30

In the optical device 30, the cured resin layer 7 is not formed between the opening 2 and the optical member 3, and the optical member 3 is directly exposed outward through the opening 2. Further, as shown in FIG. 13, in the optical device 30, in addition to the optical member 3, other components 14 such as a switch mechanism may be provided at a position facing the opening 2, for example. In these cases, the optical device 30 can expose the components 14 of the various mechanisms provided on the optical member 3 and the images of the optical member 3 directly outward through the opening 2 thereby compatible to design and operability of diversified optical devices 30.

REFERENCE SIGNS LIST 1 cover member, 2 opening, 2a inner side surface, 3 optical member, 4 mold member, 4a main surface, 5 laminated body, 6 curable resin, 7 cured resin layer, 8 deformed part, 10 side wall, 11 fitting projection, 12 deformed projection, 13 dispenser, 30 optical device

The invention claimed is:
1. An optical device manufacturing method comprising:
closely laminating a cover member having an opening onto a mold member having a fitting projection which fits to the opening so that the fitting projection is fitted to the opening to form a hollow laminated body capable of being filled with a curable resin,
filling a hollow portion of the hollow laminated body with the curable resin;
curing the curable resin to form a cured resin layer on the cover member;
peeling off the mold member from the cover member; and
bonding the cured resin layer and an optical member.
2. The optical device manufacturing method according to claim 1, wherein the optical member is an image display panel or a touch panel.

3. The optical device manufacturing method according to claim 1, wherein the mold member is an elastic member.

4. The optical device manufacturing method according to claim 3, wherein the mold member is made of a silicone rubber material.

5. The optical device manufacturing method according to claim 1, wherein the mold member is provided with a wall portion for adjusting the distance to the cover member.

6. The optical device manufacturing method according to claim 1, wherein the mold member has an open end for injecting the curable resin into the hollow portion of the hollow laminated body.

7. The optical device manufacturing method according to claim 1, wherein the cover member is concavely processed with respect to the mold member.

8. The optical device manufacturing method according to claim 1, wherein the cover member is convexly processed with respect to the mold member.

9. The optical device manufacturing method according to claim 1, further comprising further curing the cured resin layer after bonding with the optical member.

10. The optical device manufacturing method according to claim 1,
wherein the curable resin is a photocurable resin, and
wherein a curing light is irradiated from the front side of the cover member or the back side of the mold member to form the cured resin layer.

11. The optical device manufacturing method according to claim 1,
wherein an outer diameter of the fitting projection gradually decreases toward an insertion end to be inserted into the opening.

12. The optical device manufacturing method according to claim 1,
wherein the mold member is provided with a contact projection that is in close contact with a surface of the cover member to form, in the cover member, a region in which the cured resin layer is not formed.

13. The optical device manufacturing method according to claim 1,
wherein the mold member is provided with a deformed projection that fits in a deformed part formed on an outer edge portion of the cover member to form, in the cover member, a region in which the cured resin layer is not formed.

14. An optical device manufactured by using the optical device manufacturing method according to claim 1, the optical device comprising:
the optical member;
the cover member having the opening and protecting a surface of the optical member; and
the cured resin layer laminated between the cover member and the optical member and have a light transmitting property,
wherein the cured resin layer is not formed between the opening and the optical member.

15. The optical device according to claim 14, wherein the cover member has a curved surface which is curved in cross-sectional view.

16. The optical device according to claim 15, wherein the opening is formed in the curved surface.

17. The optical device according to claim 14,
wherein the optical member is an image display member, and
wherein the cured resin layer covers a display surface of the image display member except between the opening and the image display member.

18. The optical device according to claim 17, wherein the opening is formed in a portion corresponding to a portion of the display surface of the image display member.

19. The optical device according to claim 14, further comprising a recess between the cover member and the optical member in which the cured resin layer is not formed.

20. The optical device according to claim 14, wherein the cover member side of the cured resin layer has a curved surface corresponding to the shape of the cover member, and the optical member side has a flat surface.

21. The optical device according to claim 14, wherein the optical member is directly exposed through the opening.

22. The optical device according to claim 14, wherein a component is exposed directly outwardly through the opening.

* * * * *